United States Patent [19]

Baxter et al.

[11] 3,870,979

[45] Mar. 11, 1975

[54] TUNING ARRANGEMENTS

[75] Inventors: Roderick Carey Baxter, Chelmsford; Dennis Edward Hart, Maldon, both of England

[73] Assignee: The Marconi Company Limited, Chelmsford, Essex, England

[22] Filed: Jan. 8, 1974

[21] Appl. No.: 431,706

[30] Foreign Application Priority Data

Jan. 19, 1973 Great Britain ...................... 3018/73

[52] U.S. Cl. ...................... 334/14, 325/171, 334/17, 334/71

[51] Int. Cl. ............................ H03j 5/18, H03j 5/22

[58] Field of Search ............ 334/11, 14, 17, 71, 78, 334/15; 333/17 M; 331/25, 36 L, 36 C; 325/171, 172, 174, 175, 177

[56] References Cited

UNITED STATES PATENTS 3,277,378 10/1966 Heaton-Armstrong ......... 325/174 X 3,611,175 10/1971 Boelke ............................ 331/25 X

FOREIGN PATENTS OR APPLICATIONS 1,065,907 4/1967 Great Britain ....................... 334/15

*Primary Examiner*—Paul L. Gensler

*Attorney, Agent, or Firm*—Baldwin, Wight & Brown

[57] ABSTRACT

An arrangement is described in which a number of tunable elements are tuned simultaneously. A signal representative of the desired tuning frequency is derived from a frequency synthesizer and applied in parallel to a number of staircase type comparators, each associated with a particular element to be tuned and providing an output on one of a number of output lines depending on the required tuning adjustment indicated by the comparator input.

6 Claims, 2 Drawing Figures

TUNING ARRANGEMENTS

Figure 1:
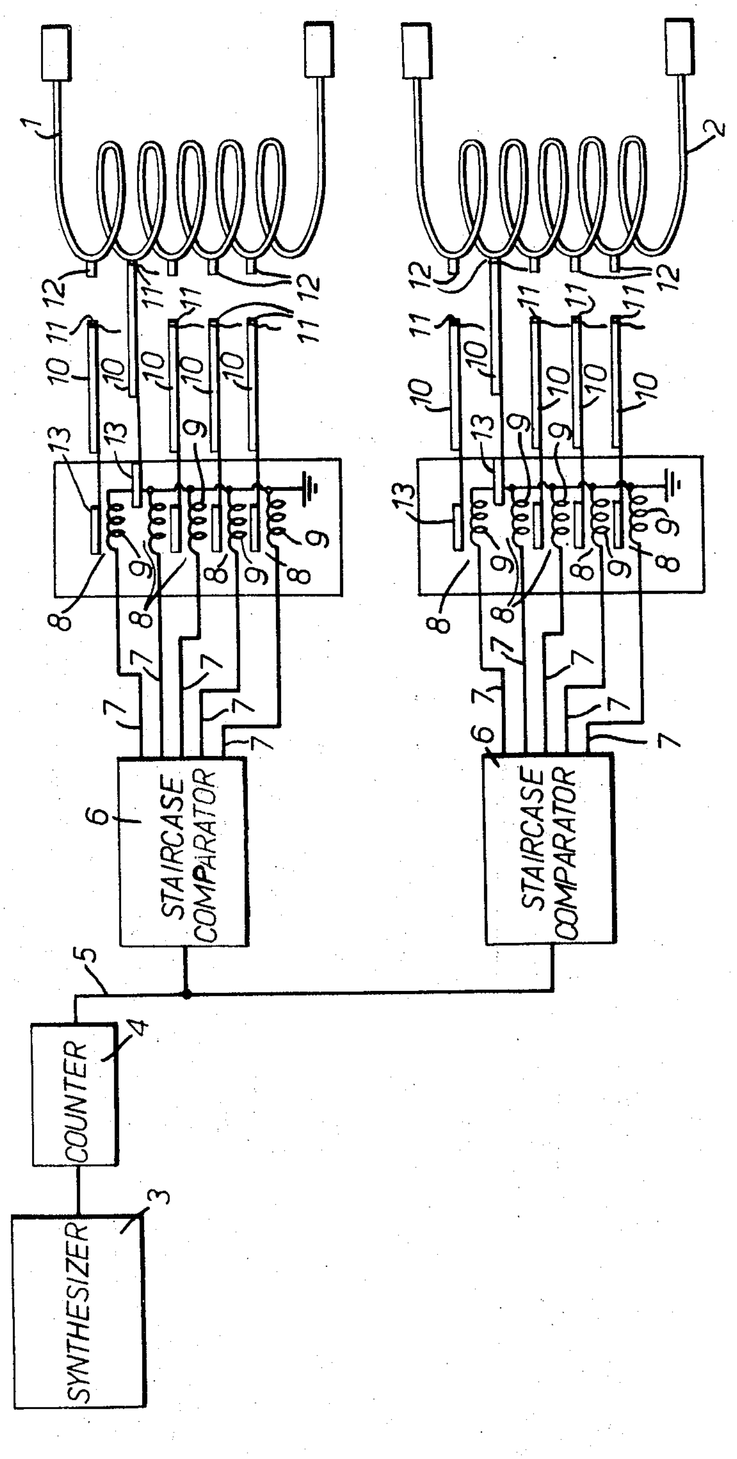

This invention relates to tuning arrangements and is particularly although not exclusively, applicable to the tuning of elements in the final amplifying stages in a transmitter. Before the output stages of a transmitter can be fine tuned with full R.F. drive applied to the amplifiers, the various components in the final stages, which require tuning, must be coarse tuned to within the capture range of the fine tuning arrangements. Components which require tuning may include the anode tuning coil of the penultimate amplifier stage and final stage components including anode tuning coil, the anode tuning capacitance and the anode coil and capacitance. The coarse tuning of these components has been done sequentially, commencing with for example the penultimate stage and finishing with say the final anode loading capacitance. Each component is driven to its coarse tuned position by a servo motor driven by an error signal generated voltage.

Each servo motor may take several seconds to drive its respective component to a position of correct tune and since each component is tuned sequentially, the whole coarse tuning process may take many seconds, a typical value, in the applicants' experience being about 15 seconds. However it is quite possible that the tuning of the final component in the chain together with the application of full R.F. drive to the output stages, may affect the tuning of the previous components and therefore necessitate a repeat of part of the coarse tuning process. The overall tuning time can therefore quite easily reach 30 seconds and consequently if it is required that the transmitting frequency range be changed, then the coarse tuning adjustments must be changed and the transmitter must of necessity be "off the air" for this period of time. In many cases it is quite unacceptable that the transmitter should be unusable over this delay period.

This invention seeks to provide tuning arrangements in which the above mentioned disadvantages are mitigated.

According to this invention an arrangement for tuning simultaneously a plurality of tunable elements comprises means for generating a signal representative of the required tuning frequency and a plurality of comparators each of said comparators associated with a different element to be tuned and arranged to receive as an input signal said representatives signal and to provide in dependence upon the desired tuning frequency an output signal on an appropriate one of a plurality of outputs, each output corresponding to a different predetermined tuning adjustment of the associated component.

Advantageously said means for generating a signal representative of the required tuning frequency comprises a controllable frequency source having an output connected to an input of a frequency counter which said counter produces said frequency representative signal output.

Preferably each of said comparators comprises a plurality of detectors each arranged to receive as two input signals said representative signal and a signal of predetermined magnitude which said magnitude corresponds to a predetermined tuning adjustment and is different for each detector and to provide an output when the two input signals are substantially equal in magnitude.

Conveniently at least one of the elements to be tuned is an inductance coil having a plurality of predetermined tapping points and contact is made to each of said tapping points by a respective one of a plurality of push rods each of said push rods being operated in response to a respective one of the plurality of outputs from a respective one of said comparators.

Figure 2:
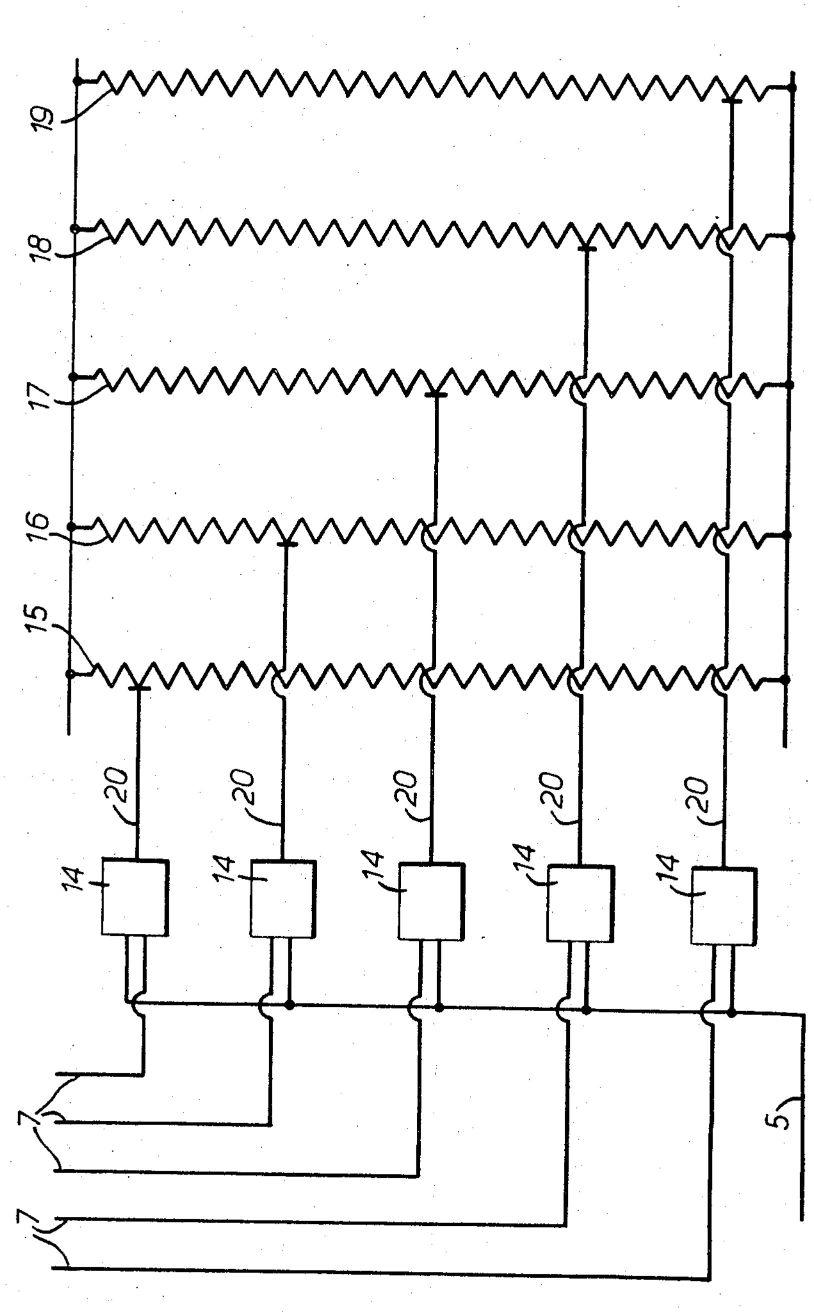

This invention will now be described with reference to the accompanying drawings in which:

FIG. 1 is a schematic diagram of an arrangement for simultaneously tuning two inductance coils, and FIG. 2 shows the more detailed construction of a typical comparator of the arrangement of FIG. 1.

Referring to FIG. 1, two inductance coils 1 and 2 are required to be tap tuned simultaneously to a particular chosen frequency range. The required tuning frequency is selected on a frequency synthesizer 3 which provides an output at the selected frequency to the input of a frequency counter 4. The synthesizer is controllable and may be adjusted over the whole of the frequency range over which the coils are required to be adjusted. The counter 4 provides a d.c. voltage output which is representative of the selected frequency input. The d.c. voltage is applied over line 5 as an input to each of two comparators 6. Each comparator 6 is a staircase generator type of comparator in which the input voltage is simultaneously compared with a number of preset voltages. The number of preset voltages used for comparison corresponds to the number of required tuning settings of each of the two coils 1 and 2 and in the present example is five.

The interrelationship between the preset voltages depends upon the tuning law of the particular component being tuned and may be varied accordingly. Each comparator 6 has in the present example five output terminals 7 and each terminal is connected to a respective one of five actuating devices 8 associated with each coil.

In the present example the actuating devices 8 are solenoids and the coil 9 of each solenoid 8 is connected to a respective output of a respective one of the comparators 6. Each comparator 6 will provide an output signal at one of the five terminals 7 depending upon which one of the preset voltages most nearly corresponds to the frequency representative voltage received from the counter 4. The output signal at the particular terminal 7 will energise the respective solenoid coil 9 thereby causing movable core 13 to move forward. Mechanically connected to each movable core 13 is an insulating push rod 10 having a metallic contact pad 11 at its tip, for enabling electrical contact to be made to the coil tapping point. The push rod 10 of the particular energised solenoid 8 travels until contact pad 11 contacts tapping point 12 where it is held by the force exerted by the energised solenoid.

In order to change the coil tapping point to correspond to a different tuning frequency range, it is only necessary to change the frequency setting on the synthesizer 3. The frequency representative voltage input to each comparator 6 will change, causing an output from each comparator 6 on a different one of the terminals 7 thereby energising a different one of the solenoids 8.

Although the arrangement shown has for ease of description been described with reference to the simultaneous tuning of only two elements, the arrangement is of course applicable to use with many more elements, there being required a comparator 6 and associated actuating circuitry for each tunable element.

In addition it is of course equally possible to use the broad principles of the invention to tune capacitors.

Referring to FIG. 2 there is shown in more detail the construction of each staircase comparator 6. Each comparator 6 comprises a number of paralleled comparators 14 each receiving as input on line 5, the frequency representative voltage output from the counter 4. Each comparator 14 has a further input 20 which input is a preset voltage obtained by tapping a potentiometer resistor 15, 16, 17, 18 or 19 individual to a particular comparator 14. The preset voltage input 20 is different for each comparator, the interrelationship between the voltages depending upon the tuning characteristics of the element being tuned.

The frequency representative voltage input at 5 is compared simultaneously in each comparator 14 with respective voltage input 20 and an output signal is provided from the comparator 14 in which there is closest match. This output is present on one of the lines 7 and passes on to the actuating means described previously.

The invention is as previously mentioned particularly suitable for coarse tuning components in the output stages of transmitters. Since all the components to be coarse tuned may be adjusted simultaneously rather than sequentially, considerable savings may be made in tuning time.

Further savings can be made if only inductances such as the anode tuning coil and loading coil of the output valves are tuned. In this case servo motors may be dispensed with for effecting tapping changes, use being made of the previously described push rod arrangement. During the coarse tuning of inductances, associated capacitances which require fine tuning are driven to their mid-range position, so as to minimise the time required to effect the fine tune adjustment.

After coarse tuning has been effected the transmitter may be switched by means of relay logic to 'fine tune,' where final adjustments are made by means of frequency discriminators of known design, which are arranged to servo drive, for example tuning capacitors, until perfect tuning is achieved.

Numerous tuning arrangements are possible using the present invention which as stated previously is not limited to any particular application or arrangement.

We claim:

1. An arrangement for tuning simultaneously a plurality of tunable elements comprising means for generating a signal representative of the required tuning frequency and a plurality of comparators each of said comparators associated with a different element to be tuned and arranged to receive as an input signal said representative signal and to provide in dependence upon the desired tuning frequency an output signal on an appropriate one of a plurality of outputs, each output corresponding to a different predetermined tuning adjustment of the associated component, each of said comparators comprising a plurality of detectors each arranged to receive as two input signals said representative signal and a signal of predetermined magnitude which said magnitude corresponds to a predetermined tuning adjustment and is different for each detector and to provide an output when the two input signals are substantially equal in magnitude.

2. An arrangement as claimed in claim 1 in which the means for generating a signal representative of the required tuning frequency comprises a controllable frequency source having an output connected to an input of a frequency counter which said counter produces said frequency representative signal output.

3. An arrangement as claimed in claim 1 in which at least one of the elements to be tuned is an inductance coil having a plurality of predetermined tapping points and contact is made to each of said tapping points by a respective one of a plurality of push rods each of said push rods being operated in response to the output signal from a respective one of said plurality of detectors forming a respective one of said comparators.

4. An arrangement as claimed in claim 3 in which the means for generating a signal representative of the required tuning frequency comprises a controllable frequency source having an output connected to an input of a frequency counter which said counter produces said frequency representative signal output.

5. An arrangement for tuning simultaneously a plurality of tunable elements comprising means for generating a signal representative of the required tuning frequency and a plurality of comparators each of said comparators associated with a different element to be tuned and arranged to receive as an input signal said representative signal and to provide in dependence upon the desired tuning frequency an output signal on an appropriate one of a plurality of outputs, each output corresponding to a different predetermined tuning adjustment of the associated component, at least one of the elements to be tuned being an inductance coil having a plurality of predetermined tapping points and contact is made to each of said tapping points by a respective one of a plurality of push rods each of said push rods being operated in response to a respective one of the plurality of outputs from a respective one of said comparators.

6. An arrangement as claimed in claim 5 in which the means for generating a signal representative of the required tuning frequency comprises a controllable frequency source having an output connected to an input of a frequency counter which said counter produces said frequency representative signal output.

* * * * *